United States Patent
Huang

(10) Patent No.: US 6,421,239 B1
(45) Date of Patent: Jul. 16, 2002

(54) INTEGRAL HEAT DISSIPATING DEVICE

(75) Inventor: Meng-Cheng Huang, Taipei Hsien (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 36 days.

(21) Appl. No.: 09/588,323

(22) Filed: Jun. 6, 2000

(51) Int. Cl.[7] .............................................. H01L 23/427
(52) U.S. Cl. ........................ 361/696; 361/697; 361/717; 165/104.33; 417/423.14
(58) Field of Search ................................ 361/687, 695, 361/696, 697, 700, 702, 710, 802, 816, 688, 690, 717–719, 735, 741, 752, 756, 760, 764, 767–769, 789; 165/80.2, 80.3, 80.4, 104.26, 104.32, 104.33, 104.34, 121, 122; 415/211.1, 213.1, 214.1, 175–178, 223; 417/423.7, 423.14; 454/184, 354; 174/15.1, 16.3, 252, 15.2; 257/706–727; 29/739, 740, 845

(56) References Cited

U.S. PATENT DOCUMENTS

| | | | | |
|---|---|---|---|---|
| 6,058,009 A | * | 5/2000 | Hood et al. | 361/687 |
| 6,109,890 A | * | 8/2000 | Horng | 417/423.14 |
| 6,122,169 A | * | 9/2000 | Liu et al. | 361/700 |
| 6,137,681 A | * | 10/2000 | Lu | 361/697 |
| 6,151,214 A | * | 11/2000 | Yeh | 361/695 |
| 6,166,906 A | * | 12/2000 | Sun et al. | 361/697 |
| 6,169,660 B1 | * | 1/2001 | Sarraf et al. | 361/717 |
| 6,241,007 B1 | * | 6/2001 | Kitahara et al. | 165/80.4 |
| 6,243,263 B1 | * | 6/2001 | Kitahara | 361/695 |
| 6,266,243 B1 | * | 7/2001 | Tomioka | 361/695 |
| 6,328,097 B1 | * | 12/2001 | Bookhardt et al. | 165/104.33 |

FOREIGN PATENT DOCUMENTS

| | | | | |
|---|---|---|---|---|
| JP | 411340391 A | * | 12/1999 | H01L/23/427 |
| JP | 02000101006 A | * | 4/2000 | H01L/23/427 |
| JP | 02000105635 A | * | 4/2000 | G06F/01/20 |
| JP | 02000227822 A | * | 8/2000 | G06F/01/20 |
| JP | 02001044348 A | * | 2/2001 | H01L/23/427 |

* cited by examiner

Primary Examiner—Lynn D. Feild
Assistant Examiner—Michael Datskovsky
(74) Attorney, Agent, or Firm—Rosenberg, Klein & Lee

(57) ABSTRACT

An integral heat dissipating device includes a radiating plate, a fan blade and a cover. The radiating plate has a heat dissipating channel. A fan blade receiving chamber is communicated with the heat dissipating channel and a heat conductive plate is connected to the bottom of the outer wall of the heat dissipating channel. The bottom of the fan blade receiving chamber is installed with an axial hole which serves to be installed with a fan blade. The axial hole can be installed with a fan blade with power. An inclined surface is formed at the upper side of the fan blade receiving chamber. A plate shape heat tube is welded between the heat conductive plate and the bottom of the heat dissipating channel. A plurality of screw retaining posts capable of being screwedly fixed to a circuit board being suspended from the lateral side of the heat conductive plate. The cover is a thin plate with a hole for sealing the upper side of the heat dissipating channel and the fan blade receiving chamber. The hole is placed above the fan blade receiving chamber for being formed as a tilt wind opening. In the present invention, the radiating plate is made integrally and can be directly connected to the fan. The shape of the heat conductive plate may include with a heat dissipating element as required. The heat conductive glue adheres to a heat conductive medium for achieving the object of high heat dissipation and low cost.

6 Claims, 5 Drawing Sheets

INTEGRAL HEAT DISSIPATING DEVICE

FIELD OF THE INVENTION

The present invention relates to an integrally formed heat dissipating device, and especially to a heat dissipating device for reducing the heat from a CPU (central processing unit) of a notebook computer, although the present invention may also be used in chips, heat resistors, heat exchangers, optical modulators, . . . and other such heat generating elements. A radiating plate is formed integrally; therefore, the number of components is less than that in the prior art, and assembly is simplified. Moreover, the heat dissipating device yields improved heat dissipation efficiency and reduced faults. Thus, the costs of manufacture and assembly are reduced greatly.

BACKGROUND OF THE INVENTION

There are two types of CPU heat dissipating devices typically used in notebook computers. One type uses convection to dissipate heat from a CPU with a fan. The other type uses transfer of heat from a CPU with a fan. In the prior art transfer type heat dissipating device, the fan 10 of the CPU heat dissipating device is separated from the radiating plate 20 and the retaining plate 30 (as shown in FIGS. 1 and 2). The radiating plate 20 has a heat dissipating channel 21 and a heat conductive plate 22 extending from an outer wall of the heat dissipating channel 21. The retaining plate 30 is a thin plate connected to the heat dissipating channel 21. The lateral side of the retaining plate 30 is formed with a plurality of screw fixing posts 31 for screw fastening to a circuit board. The fan 10 can be installed at one side of the heat dissipating channel 21. When the surface of the radiating plate 22 is adhered by a conductive glue to a heat generating element, the heat from the heat generating element can be transferred through the heat conductive glue, radiating plate 22, and heat dissipating channel 21, to be blown out by the fan 10 through the heat dissipating channel 21.

A significant drawback in the aforesaid CPU heat dissipating device is that the components are too many, requiring much work for assembly of the device. Furthermore, the housing of the fan 10 is sufficiently high to affect the design. Given that greater compactness is the trend in the design of notebook computers, such a fan is unsuitable for installation within a notebook computer.

SUMMARY OF THE INVENTION

Accordingly, a primary object of the present invention is to provide an integral heat dissipating device, by which a heat dissipating fan blade may be directly secured to the radiating plate for improving the heat dissipating efficiency, and for reducing total cost and fault.

Another object of the present invention is to provide an integral heat dissipating device which provides a heat conductive plate to contact a heat generating element (in all aspects).

A further object of the present invention is to provide an integral heat dissipating device, wherein a fan blade receiving chamber at the radiating plate is designed as a tilt opening; and wherein, a lateral wall of the fan blade receiving chamber is further installed with an air hole for increasing the amount of air intake.

In order to achieve the aforesaid objects, the present invention provides an integral heat dissipating device, which includes a radiating plate, a fan blade, and an upper cover, wherein such components are integrally formed. These components are made of material with high heat dissipating efficiency (for example, aluminum alloy). The radiating plate has a heat dissipating channel. A fan blade receiving chamber is formed with the heat dissipating channel, and a heat conductive plate is connected to the bottom of an outer wall of the heat dissipating channel. The bottom of a fan blade receiving chamber is installed with an axial hole through which is passed a spindle of a fan. The axial hole can also pass a cable for providing the fan blade with power. A plate shaped heat pipe is welded between the heat conductive plate and the heat dissipating channel. The heat conductive plate is designed to cover the heat generating element. A plurality of screw retaining posts for screw fastening to a circuit board project from laterally extended portions of the heat conductive plate.

The upper cover is a thin plate with a hole for sealing the upper side of the heat dissipating channel and the fan blade receiving chamber. The hole is placed above the fan blade receiving chamber to form an air opening. A heat conductive glue adheres the heat conductive plate to the heat generating element. Further, a bottom plate is installed below the radiating plate, and a plurality of telescopic studs for screw fastening to a circuit board are formed on the bottom plate.

In the present invention, the radiating plate is made integrally and can be directly connected to the fan. The shape of the heat conductive plate may correspond to that of the heat generating element as required. The heat conductive glue serves as a heat conductive medium for achieving the object of heat dissipation and low cost. Therefore, heat from the heat generating element is transferred through the heat conductive glue, the heat conductive plate, the plate shaped heat pipe, and the heat dissipating channel. The fan blade in the receiving chamber then serves to blow heat out of the heat dissipating channel so as to achieve the object of heat dissipation.

The various objects and advantages of the present invention will be more readily understood from the following detailed description when read in conjunction with the appended drawings.

DETAILED DESCRIPTION OF THE PREFERRED EMBODIMENTS

Figure 1:
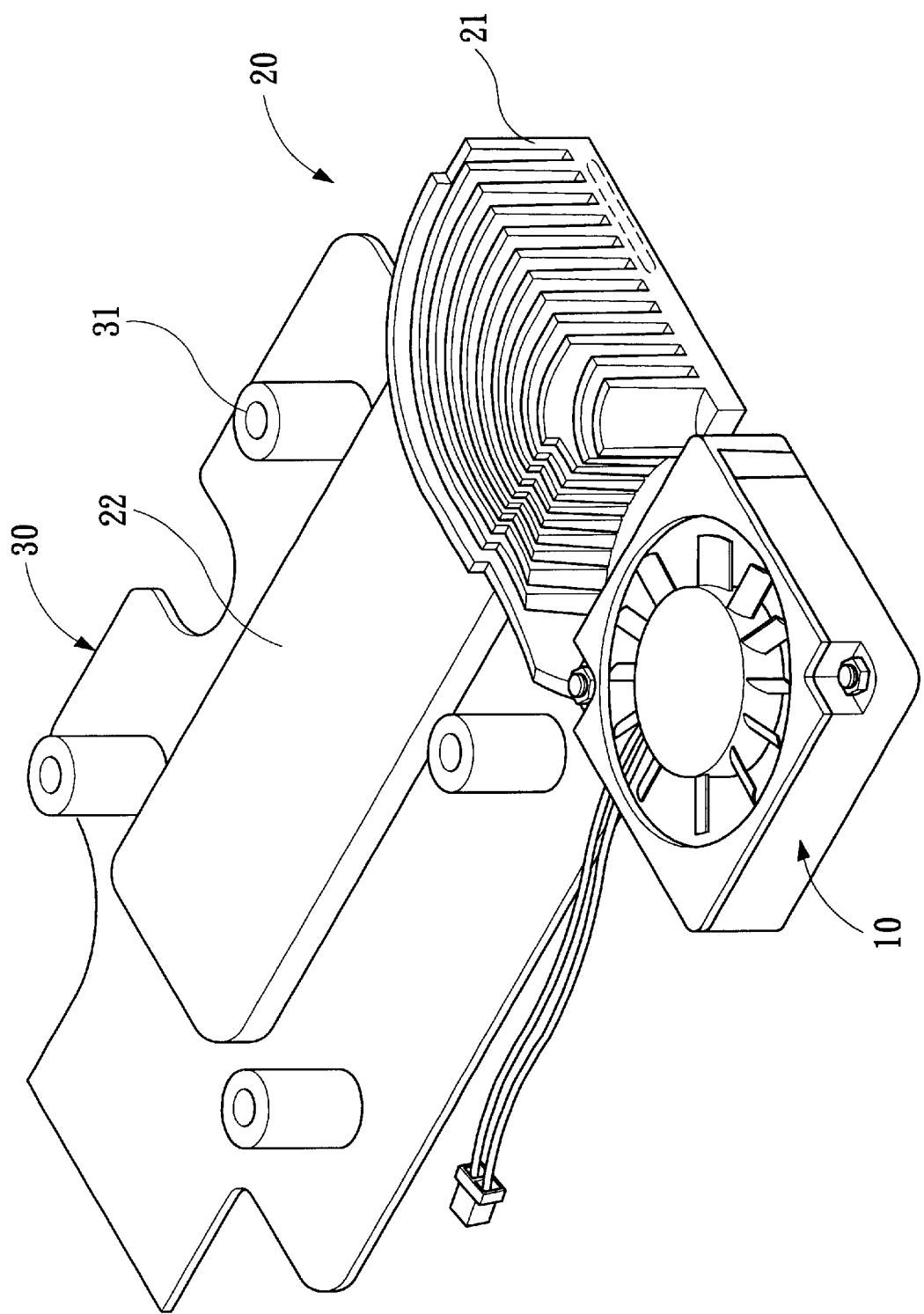
FIG. 1 is a perspective view of a prior art heat dissipating device.
Figure 2:
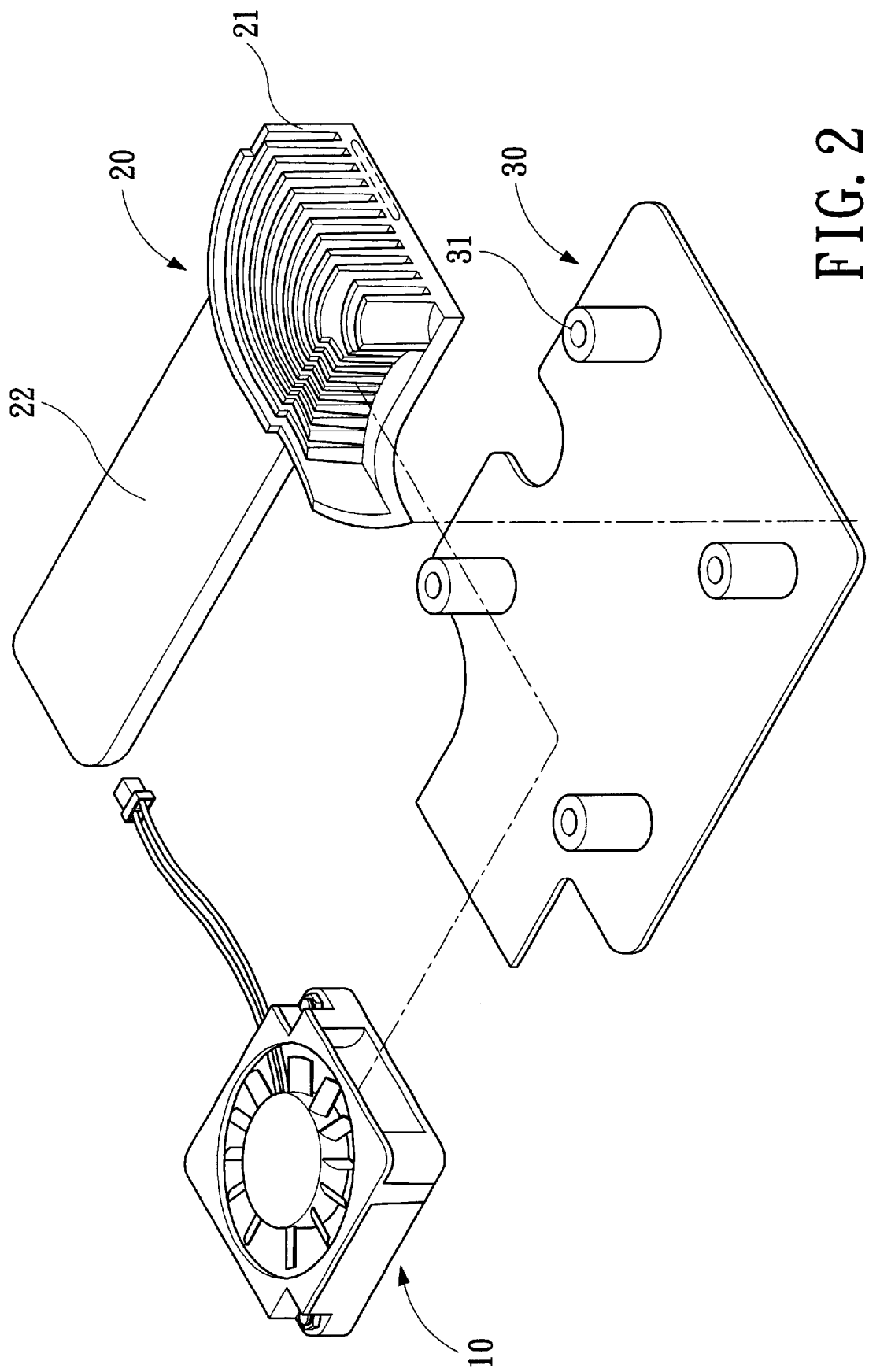
FIG. 2 is an exploded perspective view of a prior art heat dissipating device.
Figure 3:
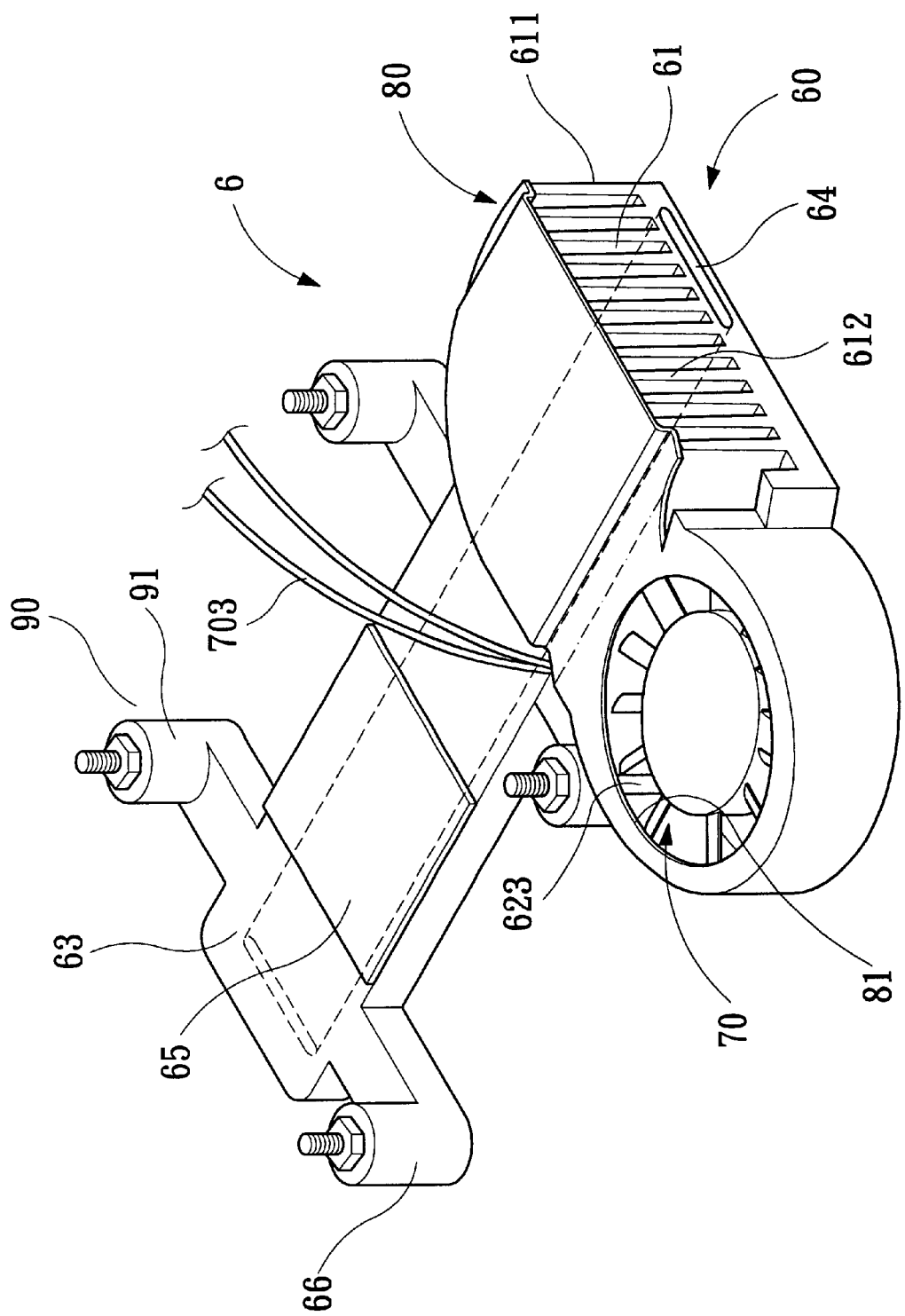
FIG. 3 is a perspective view of the heat dissipating device formed in accordance with one embodiment of the present invention.
Figure 4:
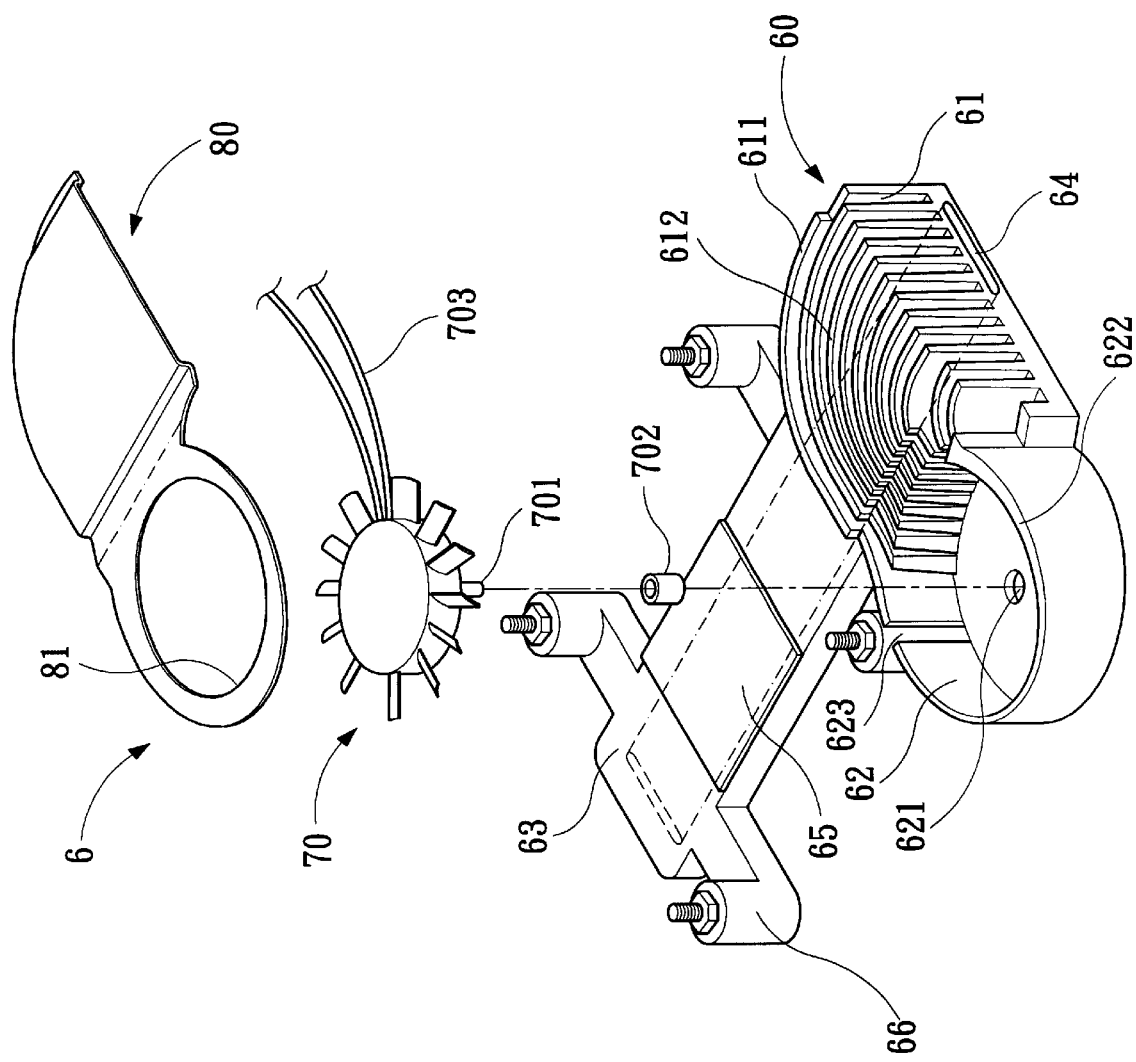
FIG. 4 is an exploded perspective view of the heat dissipating device of the present invention shown in FIG. 3.
Figure 5:
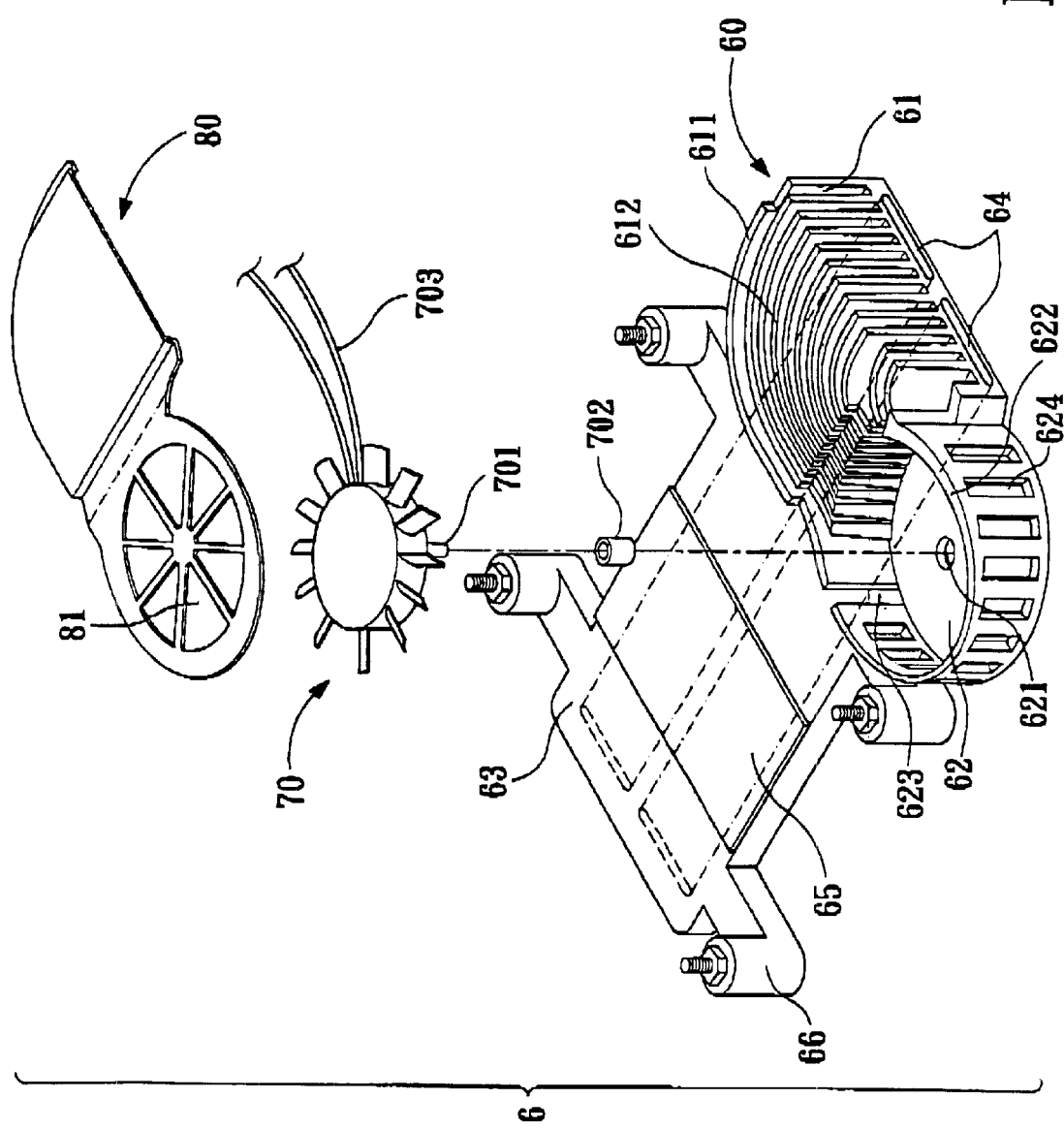
FIG. 5 is an exploded perspective view of an alternate embodiment of the heat dissipating device of the present invention.

With reference to FIGS. 3 and 4, the perspective and exploded perspective views of one embodiment of the integral heat dissipating device of the present invention are illustrated. The integral heat dissipating device 6 according to the present invention includes a radiating plate 60, a fan blade 70, and a cover 80. The radiating plate 60 has a heat dissipating channel 61, a fan blade receiving chamber 62 communicating with the heat dissipating channel 61, and a heat conductive plate 63 connected to the bottom of an outer wall 611 of the heat dissipating channel. The bottom of the fan blade receiving chamber 62 is formed with an axial hole 621 through which a spindle 701 of a fan blade 70 may pass. One or more air holes (624 in the embodiment of FIG. 5) can be formed at a lateral wall of the fan blade receiving chamber 62. An inclined contour is formed by the upper side of the lateral wall of the fan blade receiving chamber 62 to form an inclined air opening 622 for improving air intake of the fan blade 70. A plate shaped heat pipe 64 is formed between the heat conductive plate 63 and the heat dissipating channel 61. A plurality of screw retaining posts 66 for screw fastening to a circuit board project from laterally extended portions of the heat conductive plate. Furthermore, the wall of the fan blade receiving chamber 62 is formed with a notch 623 for passing therethrough a power wire 703 of the fan. An electric fan blade with power is thus arranged within the fan blade receiving chamber 62. A stator coil and a rotor coil are installed within the fan blade 70, while a bushing 702 is firmly secured to the spindle 701 on the stator, and is forced into the axial hole 621 (or the spindle 701 and the axial hole 621 can be tightly engaged with one another). The upper cover 80 is configured as a thin plate having a hole 81. This thin plate extends over the heat dissipating channel 61 and the fan blade receiving chamber 62. The hole 81 is disposed above the fan blade receiving chamber 62 to form an air inlet.

The aforesaid radiating plate 60 is integrally formed from a material having a high heat dissipating coefficient (for example, aluminum or gold). Further, as shown in the alternate embodiment of FIG. 5, the heat dissipating channel 61 may be further installed with a plurality of grids 612, and a plurality of plate shaped heat pipes 64 can be further installed. The hole 81 on the upper cover 80 may be replaced by a plurality of holes having a small size for improving heat dissipating rate and safety.

In installation, a heat conductive glue 65 may be applied on the plate 63 to adhesively contact it with a heat generating element (not shown). The heat from the heat generating element is transferred through the heat conductive glue 65, heat conductive plate 63, plate shaped heat pipe 64, and heat dissipating channel 61. Then, the fan blade 70 is operable to blow heat out of the heat dissipating channel 61 so as to achieve the object of heat dissipation.

In summary, the present invention provides an integral heat dissipating device. The fan blade can be directly secured to the radiating plate. The heat conductive plate may wholly and completely contact a surface of the heat generating element. The fan blade receiving chamber has a tilt air inlet for improving the heat dissipating efficiency, reducing total cost and fault.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An integral heat dissipating device for a heat generating element comprising:

(a) an integrally formed radiating plate including:
      a heat dissipating channel portion defining a plurality of air grids and having an outer wall;
      a fan blade receiving chamber portion disposed in open communication with said heat dissipating channel portion, said fan blade receiving chamber portion having a lateral wall formed about a bottom surface, said bottom surface having formed therein an axial hole, said lateral wall having an inclined upper side to define a sectionally inclined air opening;
      a heat conductive plate portion extending from said outer wall of said heat dissipating channel portion for at least partially overlaying the heat generating element, said heat conductive plate portion having a plurality of screw retaining posts projecting from respective laterally extended parts thereof; and,
      at least one plate shaped heat pipe portion disposed between said heat conductive plate and heat dissipating channel portions;
   (b) a heat conductive glue applied to said heat conductive plate portion of said radiating plate for adhesively joining said heat conductive plate portion to the heat generating element;
   (c) a fan blade assembly disposed in said fan blade receiving chamber portion of said radiating plate, said fan blade assembly including a stator coil, a rotor coil, and a spindle extending through said axial hole; and,
   (d) a cover coupled to said radiating plate, said cover having substantially a thin plate configuration, said cover including a first portion extending over and enclosing an upper part of said heat dissipating channel portion, and a second portion extending over said fan blade receiving chamber portion, said second portion having at least one hole formed therein to define an air inlet;
      wherein heat generated by the heat generating element is transferred through said heat conductive glue and said radiating plate, said fan blade assembly being operable to expel the transferred heat out through said heat dissipating channel portion of said radiating plate.

2. The integral heat dissipating device as recited in claim 1 wherein said fan blade assembly further includes a bushing coaxially coupled to said spindle, said bushing securely engaging said axial opening of said radiating plate fan blade receiving chamber portion.

3. The integral heat dissipating device as recited in claim 1 wherein said lateral wall of said radiating plate fan blade receiving chamber portion has formed therein a plurality of air holes.

4. The integral heat dissipating device as recited in claim 1 wherein said second portion of said cover has formed therein a plurality of said holes.

5. The integral heat dissipating device as recited in claim 1 wherein said radiating plate includes a plurality of said plate shaped heat pipes disposed between said heat dissipating channel and heat conductive plate portions.

6. The integral heat dissipating device as recited in claim 1 wherein said lateral wall of said radiating plate fan blade receiving chamber portion has formed therein a notch for receiving a power cord of said fan blade assembly.

\* \* \* \* \*